(12) United States Patent
Takabe et al.

(10) Patent No.: US 7,568,792 B2
(45) Date of Patent: Aug. 4, 2009

(54) PIEZOELECTRIC ELEMENT, ACTUATOR DEVICE, LIQUID-JET HEAD AND LIQUID-JET APPARATUS

(75) Inventors: Motoki Takabe, Nagano-ken (JP); Koji Sumi, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 480 days.

(21) Appl. No.: 11/389,218

(22) Filed: Mar. 27, 2006

(65) Prior Publication Data
US 2006/0256165 A1    Nov. 16, 2006

(30) Foreign Application Priority Data
Mar. 28, 2005    (JP)    ............... 2005-092287

(51) Int. Cl.
B41J 2/045    (2006.01)
H01L 41/00    (2006.01)

(52) U.S. Cl. .................. 347/68; 310/311; 310/321

(58) Field of Classification Search ................ 347/70, 347/71
See application file for complete search history.

(56) References Cited

U.S. PATENT DOCUMENTS

| 6,294,860 | B1 | 9/2001 | Shimada et al. |
| 6,499,837 | B2 | 12/2002 | Murai |
| 6,728,093 | B2 | 4/2004 | Fox |
| 6,841,192 | B2 * | 1/2005 | Hashimoto et al. .......... 427/100 |
| 7,033,001 | B2 | 4/2006 | Fujii et al. |
| 2003/0076007 | A1 | 4/2003 | Murai |
| 2004/0090500 | A1 | 5/2004 | Murai |
| 2004/0155559 | A1 | 8/2004 | Ifuku et al. |

FOREIGN PATENT DOCUMENTS

| EP | 0 764 992 A1 | 3/1997 |
| EP | 1 329 964 A2 | 7/2003 |
| JP | 2001-203404 A | 7/2001 |
| JP | 2004-349712 A | 12/2004 |
| KR | 2003-0085538 A | 11/2003 |

* cited by examiner

Primary Examiner—Matthew Luu
Assistant Examiner—Lisa M Solomon
(74) Attorney, Agent, or Firm—Sughrue Mion, PLLC

(57) ABSTRACT

Provided are an a piezoelectric element, an actuator device, a liquid-jet head and a liquid-jet apparatus which exhibit excellent displacement characteristics; the piezoelectric element is configured of a lower electrode, a piezoelectric layer and an upper electrode; and the half-value width of the (100) planes is not larger than 0.2 degrees, and the half-value width of the (200) planes is not smaller than 0.25 degrees, when the face surface of the piezoelectric layer is measured by means of the wide-angle X-ray diffraction method.

8 Claims, 7 Drawing Sheets

PIEZOELECTRIC ELEMENT, ACTUATOR DEVICE, LIQUID-JET HEAD AND LIQUID-JET APPARATUS

The entire disclosure of Japanese Patent Application No. 2005-092287 filed Mar. 28, 2005 is expressly incorporated by reference herein.

BACKGROUND OF THE INVENTION

1. Field of the Invention

The present invention relates to a piezoelectric element configured of a lower electrode, a piezoelectric layer and an upper electrode; an actuator device fabricated by providing piezoelectric elements on a substrate with a vibration plate between the group of piezoelectric elements and the substrate; a liquid-jet head for ejecting droplets from nozzle orifices by use of the actuator device; and a liquid-jet apparatus.

2. Description of the Prior Art

An inkjet recording head with the following configuration has been put into practical use. In accordance with the configuration, parts respectively of pressure generating chambers communicating with nozzle orifices are constructed with a vibration plate. The nozzle orifices are those from which ink droplets are ejected. The vibration plate is distorted by piezoelectric elements, and thus ink in each of the pressure generating chambers is pressurized. Accordingly, ink droplets are ejected from each of the nozzle orifices. An inkjet recording head which is constructed, for example, in the following manner is among such inkjet recording heads. An even layer made of a piezoelectric material is formed on the entire surface of the vibration plate by use of a film-forming technique. Then, this layer made of the piezoelectric material is cut into shapes corresponding to the pressure generating chambers by the lithography method. Thereby, the piezoelectric elements are formed respectively in the pressure generating chambers in order that the piezoelectric elements can be independent from one another.

A piezoelectric element having a piezoelectric layer as follows is among piezoelectric elements used for such inkjet recording heads. The piezoelectric layer constitutes the piezoelectric element, and the half-value width of the (100) planes of the piezoelectric layer is defined as being not larger than 2.0 degrees when the face surface of the piezoelectric layer is measured by means of a wide-angled X-ray diffraction method (See the scope of claims and the like in Japanese Patent Laid-open Official Gazette No. 2001-203404, for example).

Although, however, the half-value width of the (100) planes of the piezoelectric layer is defined in this manner, information on an B-site atom is unknown. This brings about a problem that displacement characteristics, such as an amount of displacement, of the piezoelectric layer are still unknown. In other words, there is a problem that the deviation of the B-site atom can not be discriminated by the mere measurement of the half-value of the (100) planes for the following reasons. When the deviation of the B-site atom from the center of a crystal is smaller, an amount of displacement of the piezoelectric layer is also smaller. When the deviation of the B-site atom from the center is larger, an amount of displacement of the piezoelectric layer is also larger.

Incidentally, such problems are not limited to liquid-jet recording heads typified by inkjet recording heads, but are similarly present in other types of piezoelectric elements and other types of actuator devices using piezoelectric elements.

SUMMARY OF THE INVENTION

With the aforementioned conditions taken into consideration, an object of the present invention is to provide a piezoelectric element, an actuator device, a liquid jet head and a liquid-jet apparatus, each of which exhibits excellent displacement characteristics.

A first aspect of the present invention for the purpose of solving the problems is a piezoelectric element characterized by being configured of a lower electrode, a piezoelectric layer and an upper electrode. Concurrently the piezoelectric element is characterized in that, when the face surface of the piezoelectric layer is measured by means of the wide-angled X-ray diffraction method, the half-value width of the (100) planes is not larger than 0.2 degrees, and the half-value width of the (200) planes is not smaller than 0.25 degrees at the same.

The first aspect makes it possible to measure the deviation of a B-site atom in the crystal by means of the half-value width of the (200) planes. Keeping the half-value width of the (200) planes not smaller than 0.25 degrees makes it possible to define the deviation of the B-site atom from the center, and to accordingly obtain excellent displacement characteristics.

A second aspect of the present invention is the piezoelectric element as recited in the first aspect, which is characterized in that the piezoelectric layer is not smaller than 300 nm in thickness.

The second aspect makes it possible to prevent the piezoelectric layer from being restrained by a substrate or the like, and to accordingly prevent the half-value widths respectively of the (100) planes and the (200) planes from being unable to be measured exactly.

A third aspect of the present invention is the piezoelectric element as recited in the first or second aspect, which is characterized in that the piezoelectric layer is made of lead-zirconat-titanate.

The third aspect makes it possible to define the deviation of a B-site atom, which is zirconium or titanium of the PZT, from the center, and to accordingly to obtain the piezoelectric layer exhibiting excellent displacement characteristics.

A fourth aspect of the present invention is an actuator device characterized by being fabricated by providing the piezoelectric elements as recited in any one of the first to the third aspects on the substrate with a vibration plate interposed between the group of the piezoelectric elements and the substrate.

The fourth aspect makes it possible to realize an actuator device exhibiting excellent displacement characteristics.

A fifth aspect of the present invention is a liquid-jet head characterized by including the actuator device as recited in the fourth aspect as liquid-eject means which ejects a liquid from nozzle orifices.

The fifth aspect makes it possible to realize a liquid-jet head exhibiting excellent liquid-jet characteristics.

A sixth aspect of the present invention is a liquid-jet apparatus characterized by including a liquid-jet head as recited in the fifth aspect.

The sixth aspect makes it possible to realize a liquid-jet apparatus exhibiting excellent liquid-jet characteristics.

DESCRIPTION OF THE PREFERRED EMBODIMENTS

Hereinafter, detailed descriptions will be provided for the present invention on a basis of embodiments thereof.

Embodiment 1

Figure 1:
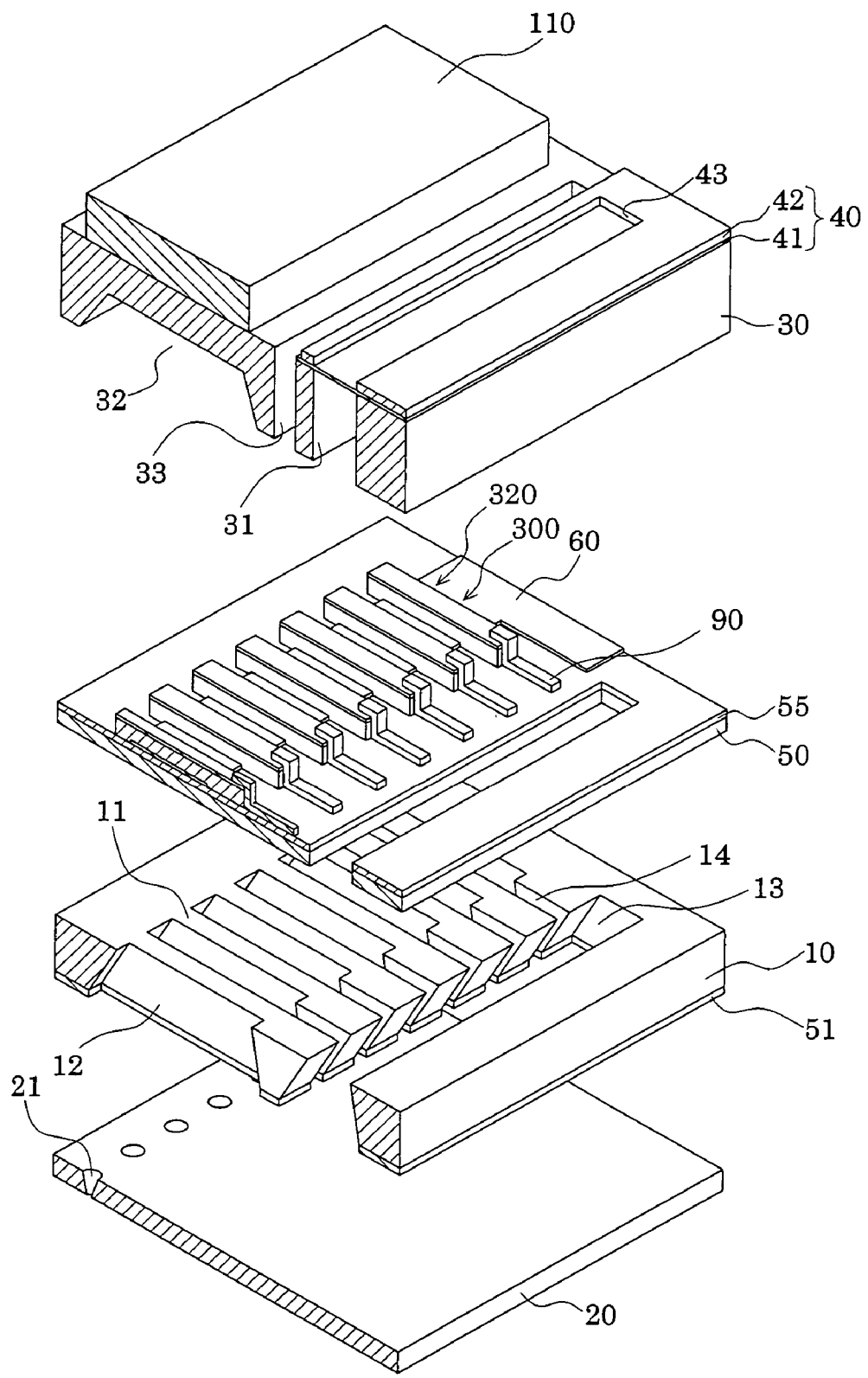
FIG. 1 is an exploded perspective view showing a schematic configuration of a recording head according to Embodiment 1 of the present invention.
Figure 2A:
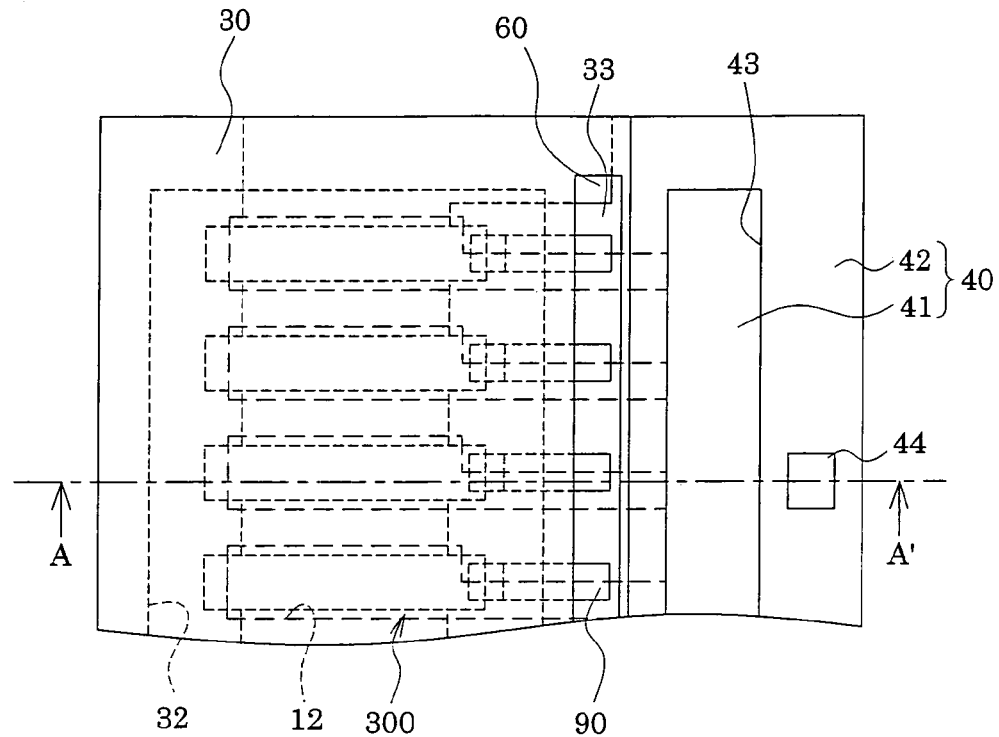
FIGS. 2A and 2B are respectively a plan and a cross-sectional views of the recording head according to Embodiment 1 of the present invention.
Figure 2B:
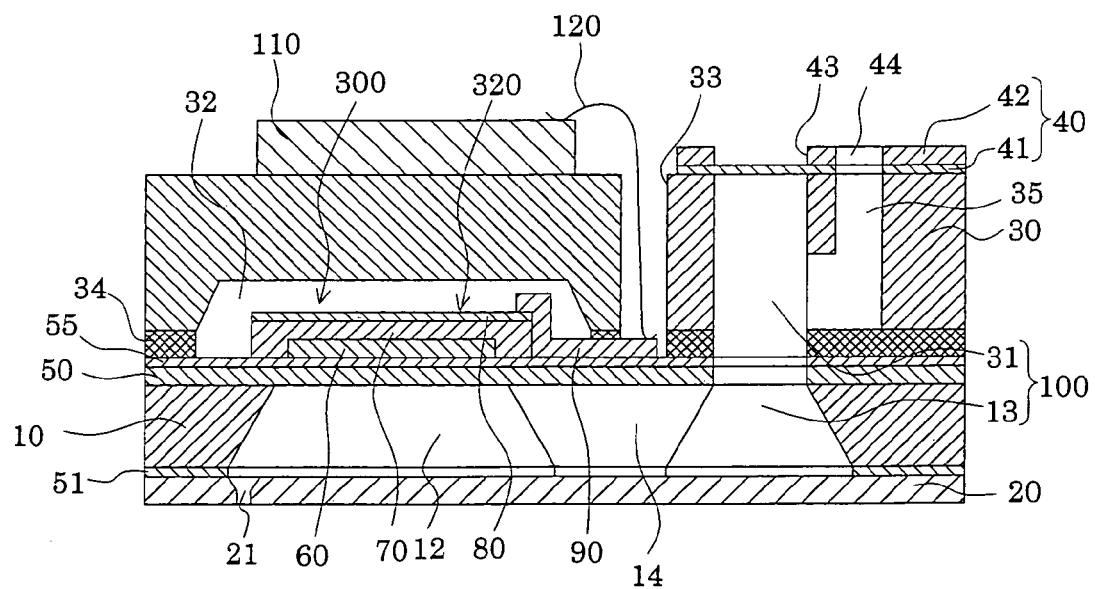

FIG. 1 is an exploded perspective view of an inkjet recording head according to Embodiment 1 of the present invention. FIG. 2A is a plan view of the inkjet recording head shown in FIG. 1, and FIG. 2B is a cross-sectional view of the inkjet recording head taken along the A-A' line of FIG. 2A.

In the case of this embodiment, a passage-forming substrate 10 is made of a single crystal silicon substrate. As illustrated, an elastic film 50 is formed on one surface of the passage-forming substrate 10. The elastic film is made of silicon dioxide beforehand formed by thermal oxidation, and has a thickness of 0.5 to 2 μm.

In the passage-forming substrate 10, a plurality of pressure generating chambers 12 compartmentalized by compartment walls 11 are arranged side-by-side by means of anisotropically etching the passage-forming substrate 10 from the other side. In the outer part of the passage-forming substrate 10 in the longitudinal direction, a communicating portion 13 is formed. The communicating portion 13 constitutes a part of a reservoir 100 which is a common ink chamber for the pressure generation chambers 12. The communicating portion 13 communicates with one end of each of the pressure generating chambers 12 in the longitudinal direction through its corresponding ink supply path 14. The ink supply paths 14 are formed with widths narrower than those of the pressure generating chambers 12, and thus keep constant the passage resistances of ink flowing from the communicating portion 13 to the respective pressure generating chambers 12.

In addition, a nozzle plate 20 is fixed to an orifice surface of the passage-forming substrate 10 with an adhesive agent, a thermal adhesive film or the like interposed in between. In the nozzle plate 20, nozzle orifices 21 are drilled. The nozzle orifices 21 communicate respectively with the pressure-generating chambers 12 at sides of the pressure-generating chambers 12 which are opposite the ink supply paths 14. Incidentally, the nozzle plate 20 is made of glass ceramic or stainless steel with a thickness of 0.01 to 1 mm, for example, and with a linear expansion coefficient which is, for example, 2.5 to 4.5[$\times 10^{-6}/^\circ$ C.] at a temperature not higher than 300° C. One surface of the nozzle plate 20 entirely covers one surface of the passage-forming substrate 10, and thus plays a role of a reinforcement plate for protecting the single crystal silicon substrate from shock and external force. In addition, it does not matter whether the nozzle plate 20 is formed of a material having a thermal expansion coefficient almost equal to that of the passage-forming substrate 10. In this case, the heat distortion of the passage-forming substrate 10 and the heat distortion of the nozzle plate 20 are almost similar to each other. For this reason, the passage-forming substrate 10 and the nozzle plate 20 can be easily joined to each other by use of a heat-hardening adhesive agent or the like.

On the other hand, as described above, the elastic film 50 is formed on a surface of the passage-forming substrate 10 which is the side opposite the orifice surface. The elastic film 50 is made of silicon dioxide, and has a thickness of, for example, approximately 1.0 μm. An insulation film 55 is formed on this elastic film 50 by laminating the insulation film 55 over this elastic film 50. The insulation film 55 is made of zirconia ($ZrO_2$) or the like, and its thickness is approximately 0.4 μm. Furthermore, a lower electrode film 60, piezoelectric layers 70 and upper electrode films 80 are formed on this insulation film 55 by laminating them over one another by use of the process described below. The lower electrode film 60, one piezoelectric layer 70 and one upper electrode film 80 constitute each of piezoelectric elements 300. The lower electrode film 60 is made of iridium (Ir), and is, for example, approximately 0.1 to 0.5 μm in thickness. Each of the piezoelectric layers 70 is made of lead-zirconate-titanate (PZT) or the like, and has a thickness of, for example, approximately 1.0 μm. Each of the upper electrodes 80 is made of gold, platinum, iridium or the like, and has a thickness of, for example, approximately 0.05 μm. In this regard, the piezoelectric element 300 is a portion including the lower electrode film 60, one piezoelectric layer 70 and one upper electrode film 80. In general, the piezoelectric element 300 is configured in the following manner. One of the two electrodes of the piezoelectric element 300 is used as a common electrode. The other of the two electrodes of the piezoelectric element 300 and the piezoelectric layer 70 are patterned in each of the pressure generating chambers 12. In a portion constituted of a patterned piezoelectric layer 70 and a corresponding patterned one of the two electrodes, piezoelectric strain occurs due to application of a voltage to the two electrodes. This portion is called a "piezoelectric active portion" 320 in this regard. In the case of this embodiment, the lower electrode film 60 is used as a common electrode for the piezoelectric elements 300, and the upper electrode films 80 are used as individual electrodes of the piezoelectric elements 300. However, it does not matter whether the use is the other way round for conveniencing the arrangement of a drive circuit and interconnects. In both cases, the piezoelectric active portions are formed respectively for the pressure generating chambers 12. In addition, a combination of one piezoelectric element 300 and a vibration plate is called a "piezoelectric actuator." The vibration plate provides a displacement depending on a drive of the piezoelectric element 300. Incidentally, in the aforementioned example, the elastic film 50 and the insulation film 55 function jointly as the vibration plate. The lower electrode film 60 constituting the piezoelectric element 300 can be also designed to perform the function of the vibration plate.

In addition, as a material for the piezoelectric layers 70, for example, a piezoelectric material (ferroelectric material) and what is obtained by adding a metallic oxide to the material are desirable. Examples of such a piezoelectric material (ferroelectric material) include lead zirconate titanate (PZT). Examples of such a metallic oxide includes niobium oxide, nickel oxide and magnesium oxide. Specifically, lead titanate (PbTiO$_3$), lead zirconate titanate (Pb(Zr, Ti) O$_3$),lead zirconate (PbZrO$_3$), lead lanthanum titanate ((Pb, La), TiO$_3$), lead lanthanum zirconate titanate ((Pb, La)(Zr, Ti)O$_3$), lead zirconium titanate magnesium niobate (Pb(Zr, Ti)(Mg, Nb) O$_3$) or the like can be used. The piezoelectric layers 70 are formed with a thickness which is small enough to prevent a crack from occurring in the piezoelectric layers 70 in the manufacturing process, and which is large enough to enable the piezoelectric layers 70 to exhibit their displacement characteristic sufficiently. In the case of this embodiment, the piezoelectric layers 70 are formed with a thickness of, for example, approximately 0.5 to 2 µm.

In addition, in the case of each of the piezoelectric layers 70 according to this embodiment, the half-value width of the (100) planes is not larger than 0.2 degrees, and concurrently the half-value width of the (200) planes is not smaller than 0.25, when the face surface of the piezoelectric layer 70 is measured by use of the wide-angled X-ray diffraction method.

Figure 7A:
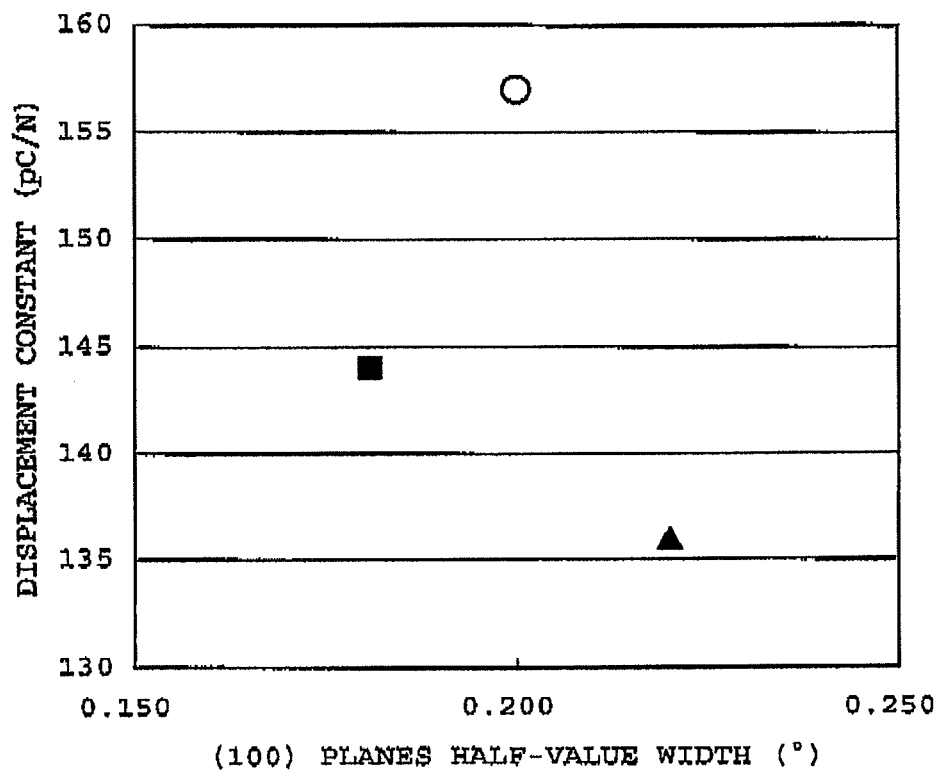
FIGS. 7A and 7B illustrate analysis results of piezoelectric layers according to an exemplary embodiment of the present application.
Figure 7B:
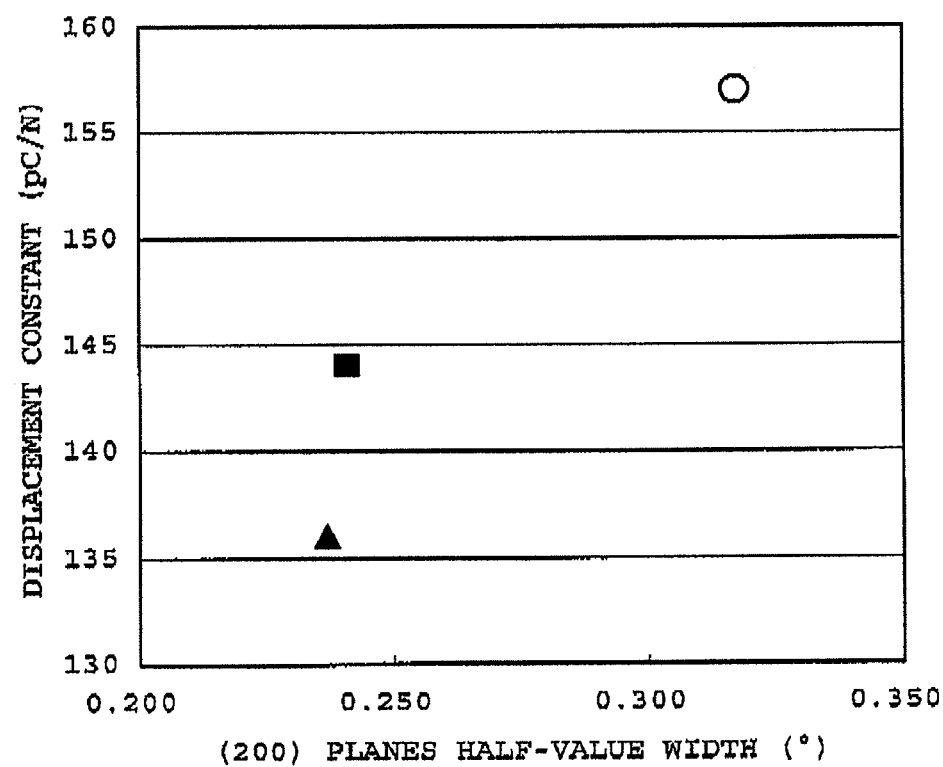

Refer to FIGS. 7A and 7B that illustrate analysis results of the piezoelectric layers 70 according to an exemplary embodiment of the present application.

In this respect, when the face surface of the piezoelectric layer 70 is measured by use of the wide-angled X-ray diffraction method, peaks of diffraction intensities corresponding respectively to the (100) and the (200) planes occur. In addition, a "half-value width" means a width of a locking curve at a half value of a peak intensity corresponding to each crystal face, the locking curve shown by an X-ray diffraction chart obtained by measuring the crystal face by means of the wide-angled X-ray diffraction method.

It should be noted that the half-value width of the (100) planes indicates the deviation of the crystal lattice of the piezoelectric layer 70 in the thickness direction. In a case where the crystal lattice of the piezoelectric layer 70 in the thickness direction is uniform in largeness, displacement characteristics of the piezoelectric layer 70 are excellent. For this reason, it is desirable that the half-value width of the (100) planes be as small as possible. In this case, the half-value width of the (100) planes indicates the deviation of the crystal lattice of the piezoelectric layer 70 in largeness.

Furthermore, the half-value width of the (200) planes indicates the deviation of a B-site atom of zirconium (Zr) or titanium (Ti) from the center of the crystal. Moreover, in a case where the deviation of the B-site atom from the center is larger, the piezoelectric layer 70 exhibits excellent displacement characteristics, including an excellent amount of displacement. For this reason, it is desirable that the half-value width of the (200) planes be as large as possible. In this case, the half-value width of the (200) planes indicates the deviation of the B-site atom in the crystal of the piezoelectric layer 70 from the center.

As described above, excellent displacement characteristics can be obtained in the case where the half-value width of the (100) planes is not larger than 0.2 degrees and concurrently the half-value width of the (200) planes is not smaller than 2.5 degrees when the face surface of the piezoelectric layer 70 according to this embodiment is measured by means of the wide-angled X-ray diffraction method. In other words, larger strain can be obtained by use of a smaller drive voltage. Accordingly, this makes it possible to realize the piezoelectric element 300 which provides larger displacement.

Furthermore, a lead electrode 90 is connected to each of the upper electrode films 80 which are individual electrodes for the respective piezoelectric elements 300. The lead electrode 90 is drawn out from the vicinity of an end of the corresponding ink supply path 14, and is extended to the top of the insulation film 55. The lead electrode 90 is made of, for example, gold or the like.

A protection plate 30 is joined to the top of the passage-forming substrate 10 over which such piezoelectric elements 300 are formed, in other words, above the lower electrode film 60, the elastic film 50 and the lead electrodes 90, with an adhesive agent 34 interposed between the protection plate 30 and the passage-forming substrate 10. The protection plate 30 includes a reservoir portion 31 constituting at least a part of a reservoir 100. In the case of this embodiment, this reservoir portion 31 is formed in a way that the reservoir portion 31 penetrates through the protection plate 30 in the thickness direction, and in a way that the reservoir portion 31 extends in a direction which is the same as the width direction of the pressure generating chambers 12. The reservoir portion 31 communicates with the communication portion 13 of the passage-forming substrate 10, and thus constitutes the reservoir 100 which is used as a common ink chamber for the pressure generating chambers 12.

Moreover, a piezoelectric element holding portion 32 is provided to a region of the protection plate 30, which region is opposite the piezoelectric elements 300. The piezoelectric element holding portion 32 has a cavity large enough not to hinder the piezoelectric elements 300 from moving. It suffices if the protection plate 30 has a cavity large enough not to hinder the piezoelectric elements 300 from moving. It does not matter whether or not the cavity is sealed up.

It is desirable that a material having a thermal expansion coefficient equal to that of the passage forming substrate 10 be used for such a protection plate 30. Examples of the material include glass and ceramics or the like. In the case of this embodiment, the protection plate 30 is formed of a single crystal silicon substrate which is the same material the passage forming substrate is formed of.

Furthermore, the protection plate 30 is provided with a through-hole 33 which penetrates through the protection plate 30 in the thickness direction. Moreover, the vicinities of the ends of the lead electrodes 90 drawn out respectively from the piezoelectric elements 300 are set up in a way that the vicinities are exposed to the through-hole 33.

Likewise, a drive circuit 110 is fixed to the top of the protection substrate 30. The drive circuit 110 drives the piezoelectric elements 300 arranged side-by-side. For example, a circuit plate, a semiconductor integrated circuit (IC) or the like can be used as this drive circuit 110. Additionally, the drive circuit 110 and each of the lead electrodes 90 are electrically connected with each other through a connecting wiring 120. The connecting wiring 120 is made of a conductive wire such as a bonding wire.

In addition, a compliance plate 40 is joined to the top of the protection plate 30. The compliance plate 40 is configured of a sealing film 41 and a fixed plate 42. In this regard, the sealing film 41 is made of a flexible material with a lower rigidity (for example, a polyphenylen sulfide (PPS) film with a thickness of 6 µm.) One end of the reservoir portion 31 is sealed up by this sealing film 41. Furthermore, the fixed plate 42 is formed of a hard material such as a metal (for example, stainless steel (SUS) or the like with a thickness of 30 µm) A region of this fixed plate 42, which region is opposite the reservoir 100, is an opening portion 43 which is obtained by completely removing a portion corresponding to the region from the fixed plate 42 in the thickness direction. Accordingly, one end of the reservoir 100 is sealed up only by the sealing film 41 which is flexible.

An ink introducing port 44 for supplying ink to the reservoir 100 is formed in a part of the compliance plate 40. The part of the compliance 40 is located outside this reservoir 100, and the location corresponds roughly to the center of the reservoir 100 in the longitudinal direction. Furthermore, the protection plate 30 is provided with an ink introduction path 35 through which the ink introduction port 44 and a side wall of the reservoir 100 communicate with each other.

Such an inkjet recording head according to this embodiment takes in ink from the ink introducing port 44 connected with external ink supply means, which is not illustrated, and fills the interior ranging from the reservoir 100 through the nozzle orifices 21 with ink. Thereafter, the inkjet recording head applies a voltage between the lower electrode film 60 and each of the upper electrode films 80 corresponding to the pressure generating chambers 12, in accordance with recording signals from the drive circuit. Thus, the inkjet recording head distorts the elastic film 50, the lower electrode films 60 and the piezoelectric layers 70 with flexure. This distortion raises the pressure of each of the pressure generating chambers 12, and thereby ink droplets are ejected from the nozzle orifices 21.

Figure 3A:
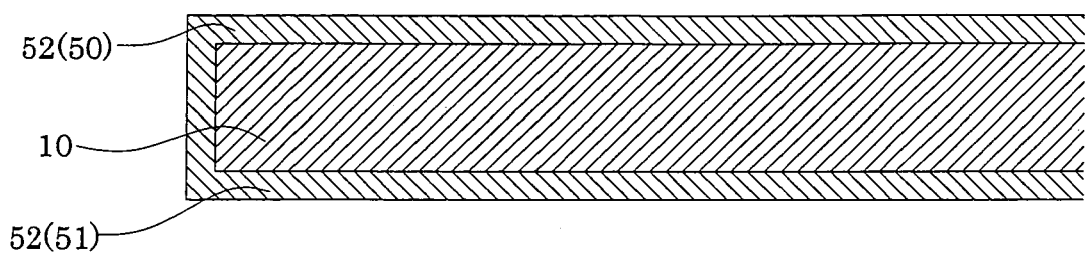
FIGS. 3A to 3C are cross-sectional views showing a method of manufacturing the recording head according to Embodiment 1 of the present invention.
Figure 3B:
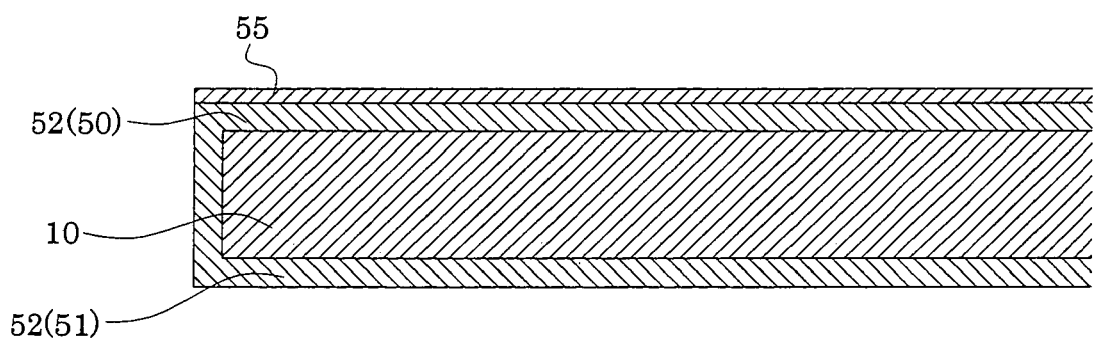

Hereinafter, descriptions will be provided for a method of manufacturing such an inkjet recording head with reference to FIGS. 3 to 5. Incidentally, FIGS. 3 to 5 are cross-sectional views of the pressure generating substrate 12 in the longitudinal direction. First of all, as shown in FIG. 3A, the passage-forming substrate 10 made of a single crystal silicon substrate is thermally oxidized in a diffusion furnace at approximately 1100° C. Thereby, a silicon dioxide 52 which will be later turned into the elastic film 50 and a protection film 51 is formed on the surfaces of the passage-forming substrate 10. Subsequently, as shown in FIG. 3B, a zirconium (Zr) layer is formed on top of the elastic film 50 (the silicon dioxide film 52). Thereafter, the insulation layer 55 made of zirconia ($ZrO_2$) is formed by means of thermally oxidizing the zirconium layer, for example, in the diffusion furnace at 500 to 1200° C.

Figure 3C:
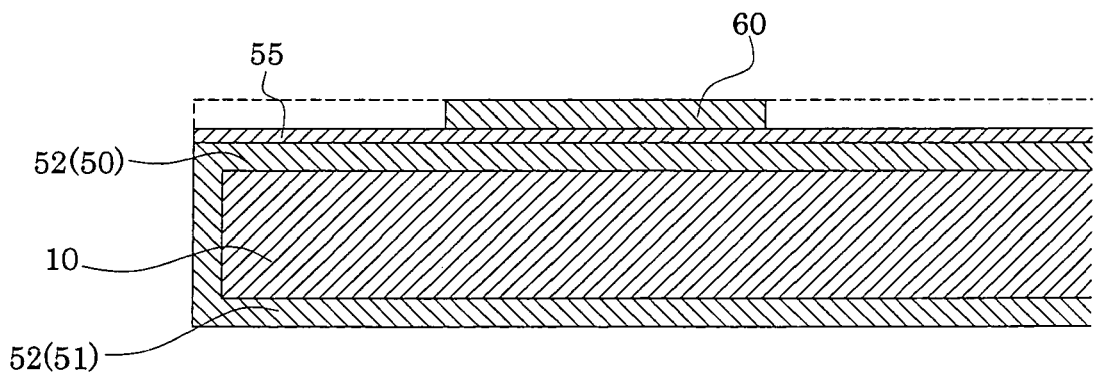

Next, as shown in FIG. 3C, the lower electrode film 60 made of iridium (Ir) is formed over the entire surface of the passage-forming substrate 10, and thereafter is patterned in the predetermined shapes.

Subsequently, the piezoelectric layer 70 made of lead-zirconate-titanate (PZT) is formed. In this respect, in the case of this embodiment, the piezoelectric layer 70 is formed by use of what is termed as the sol-gel method. In accordance with the sol-gel method, what is termed as sol is obtained by dissolving and dispersing a metal-organic substance in a catalytic agent. This sol is turned into gel by application and drying. Then, the gel is baked at a high temperature. Thereby, the piezoelectric layer 70 made of a metal-oxide substance is obtained. Incidentally, a material for the piezoelectric layer 70 is not limited to lead-zirconate-titanate. It does not matter whether another piezoelectric materials, for example, a relaxor ferroelectric (e.g. PMN-PT, PZN-PT, PNN-PT or the like) is used. In addition, the method of manufacturing the piezoelectric layer 70 is not limited to the sol-gel method. It does not matter whether, for example, the MOD (Metal-Organic Decomposition) method or the like is used.

Figure 4A:
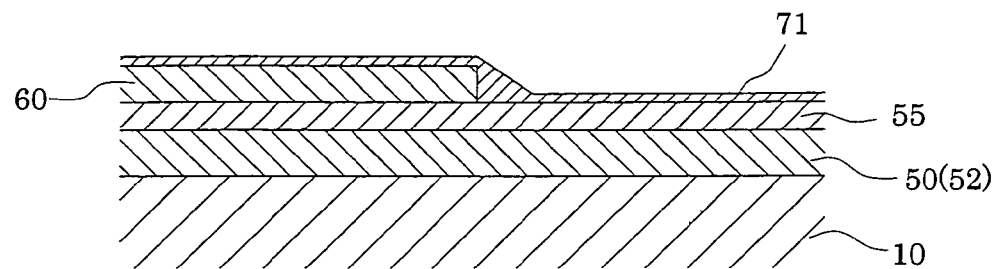
FIGS. 4A to 4C are cross-sectional views showing the method of manufacturing the recording head according to Embodiment 1 of the present invention.

A specific procedure of forming the piezoelectric layer 70 is as follows. First of all, an adhesion layer made of titanium (Ti) is formed on the lower electrode film 60, although the adhesion layer is not illustrated. Thereafter, as shown in FIG. 4A, a piezoelectric precursor film 71 is formed on top of the lower electrode film 60. The piezoelectric precursor film 71 is a PZT precursor film. In other words, the sol (liquid solution) containing the metal-organic substance is applied to the top of the lower electrode film 60 which has been formed above the passage-forming substrate 10 (in the applying step) Subsequently, this piezoelectric precursor film 71 is heated at a predetermined temperature, and thus is dried for a certain length of time. In the case of this embodiment, the piezoelectric precursor film 71 can be dried, for example, by means of keeping the piezoelectric precursor film 71 at 170-180° C. for 8 to 30 minutes. Furthermore, it is desirable that the rate of temperature rise in the drying step be 0.5 to 1.5° C./sec. Incidentally, the "rate of temperature rise," which has been referred to in this respect, is defined as a rate of change of temperature from Temperature 1 through Temperature 2 with respect to time. Temperatures 1 and 2 are calculated in the following manner. To begin with, the difference between a temperature (room temperature), at which the heating is started, and a temperature which the piezoelectric precursor film 70 reaches by the heating is obtained. Then, Temperature 1 is obtained by adding 20% of the difference to the temperature at which the heating is started. Temperature 2 is obtained by adding 80% of the difference to the temperature at which the heating is started. In a case where, for example, the temperature is raised from room temperature (25° C.) to 100° C. in 50 seconds, the rate of temperature rise is expressed with the following equation.

$$(100-25) \times (0.8-0.2)/50 = 0.9 \, [° C./sec]$$

Subsequently, the piezoelectric precursor film 71, which has been dried, is degreased by means of heating the piezoelectric precursor film 71 to a predetermined temperature and keeping the film at that temperature for a certain length of time. In the case of this embodiment, the piezoelectric precursor film 71 is degreased, for example, by means of heating the film to a temperature of approximately 300 to 400° C. and keeping the film at the temperature for approximately 10 to 30 minutes. Incidentally, the degreasing, which has been referred to in this respect, means to eliminate organic components contained in the piezoelectric precursor film 71 therefrom, for example, as $NO_2$, $CO_2$, $H_2O$ and the like. In the degreasing step, it is desirable that the rate of temperature rise be 0.5 to 1.5° C./sec.

Figure 4B:
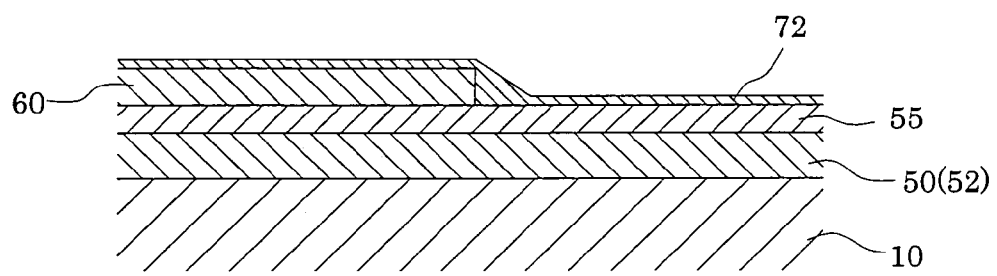

Then, the piezoelectric precursor film 71 is heated to a predetermined temperature, and is kept at the temperature for a certain length of time, and thus is crystallized. Accordingly, a piezoelectric film 72 is formed (in the baking step), as shown in FIG. 4B. In the baking step, it is desirable that the piezoelectric precursor film 71 be heated to a temperature of 680 to 900° C. In the case of this embodiment, the piezoelectric precursor film 71 is baked by means of heating the piezoelectric precursor film 71 at 680° C. for 5 to 30 minutes, and thus the piezoelectric layer 72 is formed. Moreover, in the baking step according to this embodiment, the rate of temperature rise is 120° C./sec.

It should be noted that, for example, an RTA (Rapid Thermal Annealing) system can be used as the heating system used for the drying, degreasing and baking steps. The RTA system performs the thermal process by means of irradiation from a hot plate, a diffusion furnace or an infrared lamp. In this embodiment, the rate of temperature rise is as high as 120° C./sec. For this reason, the RTA system which can perform the baking process at such a high rate of temperature rise is used.

Likewise, in the case of this embodiment, as described above, the adhesion layer, which is not illustrated, made of titanium (Ti) is formed on the lower electrode film 60. Thereafter, a piezoelectric film 72 is formed. Thereby, PZT is grown by using titanium crystals as cores. This causes crystals to grow from the lower electrode film 60, and accordingly makes it possible to obtain dense columnar crystals. Such an adhesion layer is diffused into the piezoelectric film 72 after baking.

Figure 4C:
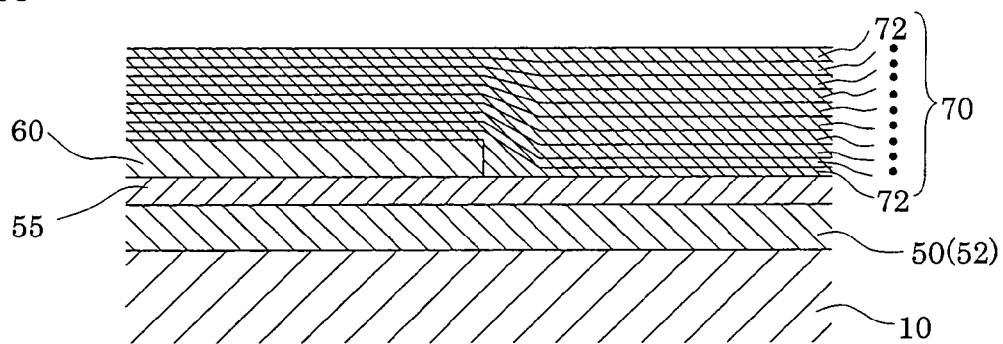

Then, the piezoelectric-layer forming step including the aforementioned applying, drying, degreasing and baking steps is repeated a plurality of times. In the case of this embodiment, the piezoelectric-layer forming step is repeated ten times. Thereby, the piezoelectric layer 70 is formed as shown in FIG. 4C. The piezoelectric layer 70 has a predetermined thickness, and includes ten piezoelectric films 72. In a case where, for example, the thickness of the sol which is applied each time is approximately 0.1 µm, the total film thickness of the piezoelectric layer 70 is approximately 1.1 µm.

When the piezoelectric layer 70 formed in this manner was measured by means of the wide-angled X-ray diffraction method, the half-value width of the (100) planes was not larger than 0.2 degrees, and concurrently the half-value width of the (200) planes was not smaller than 0.25 degrees. If, in this manner, the piezoelectric layer 70 is formed in a way that the half-value widths can be equal to the predetermined values respectively, excellent displacement characteristics can be obtained.

Figure 5A:
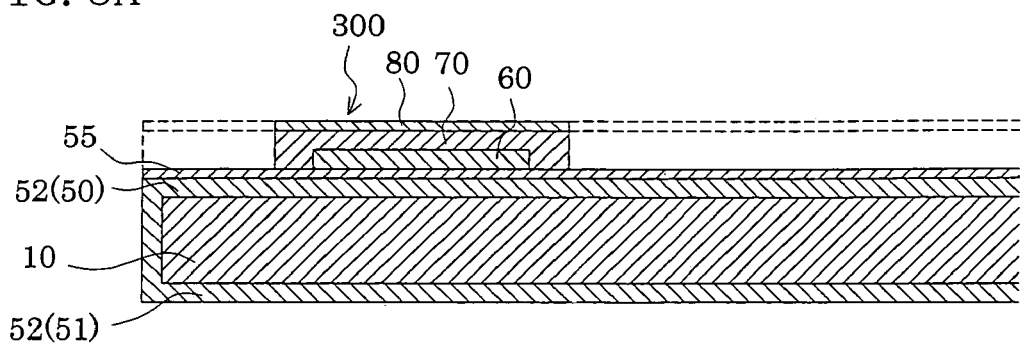
FIGS. 5A to 5D are cross-sectional views showing the method of manufacturing the recording head according to Embodiment 1 of the present invention.
Figure 5B:
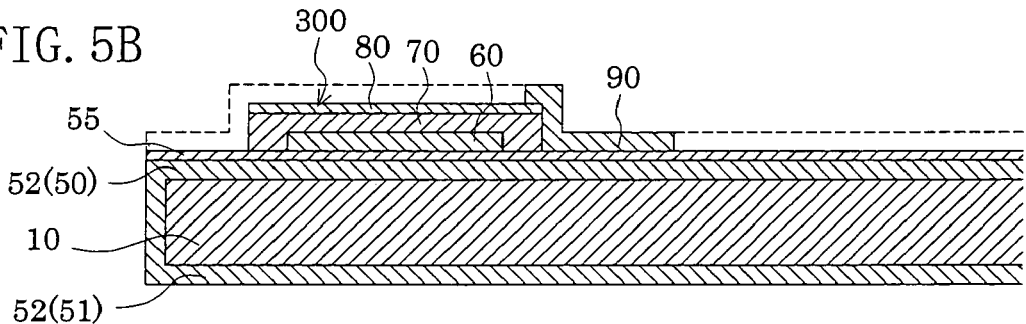

In addition, after the piezoelectric layer 70 is formed through the steps as shown in FIG. 4A to 4C, the upper electrode film 80 is formed above the entire surface of the passage-forming substrate 10, as shown in FIG. 5A. The upper electrode film 80 is made, for example, of iridium. Then, the piezoelectric layer 70 and the upper electrode film 80 are patterned in each of the regions respectively opposite the pressure generating chambers 12. Thus, the piezoelectric elements 300 are formed. Subsequently, the lead electrodes 90 are formed. Specifically, the lead electrodes 90 are formed in the following manner. First, a lead electrode 90 is formed over the entire surface of the passage-forming substrate 10 as shown in FIG. 5B. The lead electrode 90 is made, for example, of gold (Au) and the like. Thereafter, the lead electrode 90 is patterned in each of the piezoelectric elements 300 by use of a mask pattern (not illustrated) made, for example, of a resist or the like.

Figure 5C:
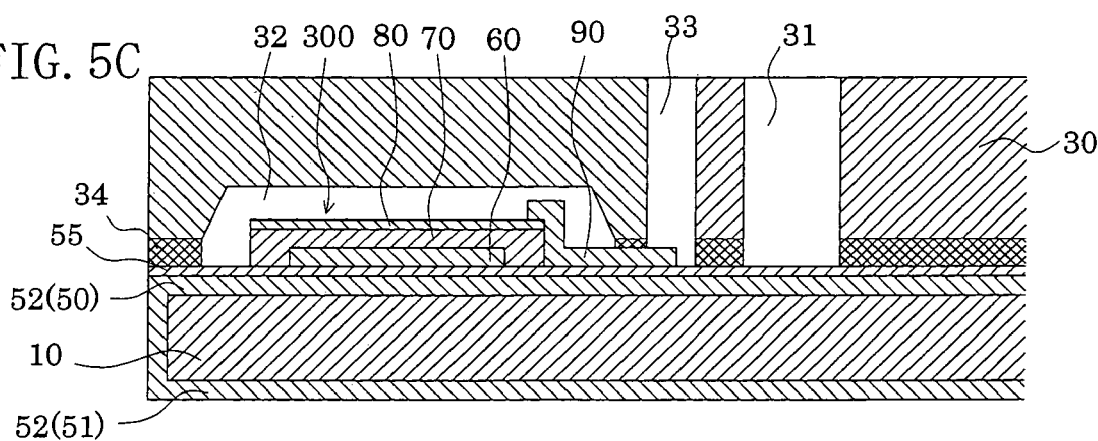

Next, as shown in FIG. 5C, the protection plate 30 is joined to the top of the passage-forming substrate 10, for example, with the adhesive agent 34. The protection plate 30 holds the plurality of piezoelectric elements 300 thus patterned. Incidentally, the reservoir portion 31, the piezoelectric element holing portion 32 and the like are beforehand formed in the protection plate 30. In addition, the protection plate 30 is made, for example, of a single crystal silicon substrate having a thickness of approximately 400 µm. The joining of the protection plate 30 to the passage-forming substrate 10 remarkably increases the rigidity of the resultant passage-forming substrate 10.

Figure 5D:
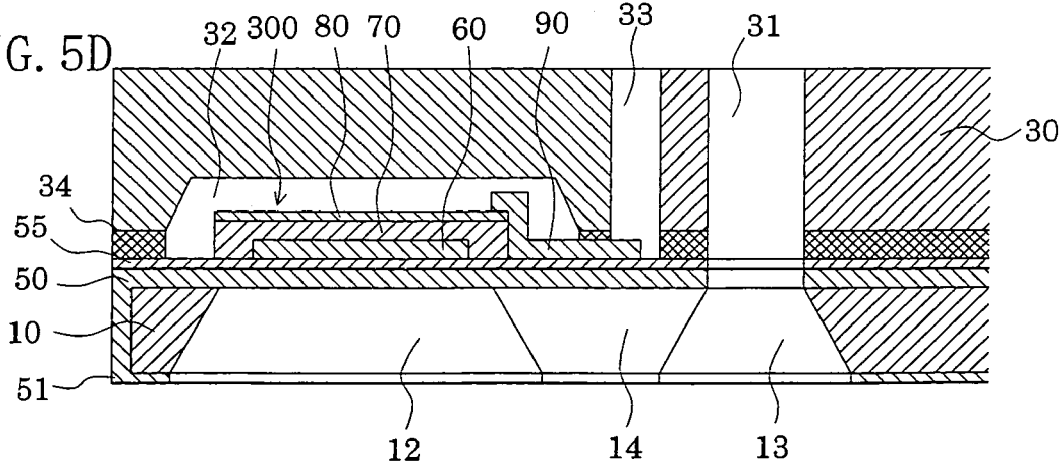

Subsequently, as shown in FIG. 5D, the protection film 51 is formed by means of patterning the silicon dioxide film 52 on a surface of the passage-forming substrate 10, into a predetermined shape, the surface being opposite the surface above which the piezoelectric elements 300 are formed. With the protection film 51 used as a mask, the passage-forming substrate 10 is caused to undergo an anisotropic etching (wet-etching) by use of an alkaline solution such as KOH. Thereby, the pressure-forming chambers 12, the communicating portion 13, the ink supply paths 14 and the like are formed in the passage-forming substrate 10.

Subsequently, the nozzle plate 20 is joined to a surface of the passage-forming substrate 10, which surface is opposite the surface to which the protection plate 30 has been joined. The nozzle orifices 21 are drilled in the nozzle plate 20. Concurrently, the compliance plate 40 is joined to the protection plate 30. Thereby, the inkjet recording head as shown in FIG. 1 is formed.

It should be noted that a large number of chips are actually formed on a single wafer at a time through the aforementioned serial of film formation processes and anisotropic etching processes. After the processes are completed, the wafer is divided into passage-forming substrates 10 each in a chip size as shown in FIG. 1. Thus, the inkjet recording heads are formed.

EXAMPLE

A piezoelectric film made of lead-zirconate-titanate (PZT) was baked at a 120° C./sec rate of temperature rise by means of the RTA system. Such piezoelectric films were laminated over one another, and thereby a piezoelectric layer according to Example was made.

COMPARATIVE EXAMPLE 1

A piezoelectric film made of lead-zirconate-titanate (PZT) was baked at a 10° C./sec rate of temperature rise by means of the RTA system. Such piezoelectric films were laminated over one another, and thereby a piezoelectric layer according to Comparative Example 1 was made.

COMPARATIVE EXAMPLE 2

A piezoelectric film made of lead-zirconate-titanate (PZT) was baked at a 1° C./sec rate of temperature rise by means of the RTA system. Such piezoelectric films were laminated over one another, and thereby a piezoelectric layer according to Comparative Example 2 was made.

EXPERIMENTAL EXAMPLE

With regard to the face surface of each of the piezoelectric layers according to Example as well as Comparative Example 1 and 2, the half-value width of the (100) planes and the half-value width of the (200) planes were measured by the wide-angled X-ray diffraction method. In addition, with regard to the face surface of each of the piezoelectric layers according to Example as well as Comparative Example 1 and 2, the deviation of the B-site atom from the center was measured by means of the Raman spectroscopic analysis method. Moreover, with regard to the face surface of each of the piezoelectric layers according to Example as well as Comparative Example 1 and 2, the displacement constant was measured. The following table shows results of these.

TABLE 1

| | RATE OF TEMPERATURE RISE (° C./sec) | (100) PLANES HALF-VALUE WIDTH (°) | (200) PLANES HALF-VALUE WIDTH (°) | DEVIATION OF B-SITE ATOM | DISPLACEMENT CONSTANT (pC/N) |
|---|---|---|---|---|---|
| EXAMPLE | 120 | 0.200 | 0.317 | LARGE | 157 |
| COMPARATIVE EXAMPLE 1 | 10 | 0.220 | 0.237 | SMALL | 136 |
| COMPARATIVE EXAMPLE 2 | 1 | 0.181 | 0.241 | SMALL | 144 |

It is learned from Table 1 that the half-value width of the (100) planes of Comparative Example 1 was larger than that of Comparative Example 2. By contrast, it is learned from Table 1 that the half-value width of the (200) planes of Comparative Example 2 was larger than that of Comparative Example 1. In addition, the displacement constant of the piezoelectric layer of Comparative Example 2 was larger than that of Comparative Example 1. Hence, the piezoelectric layer of Comparative Example 2 was better than that of Comparative Example 1 in terms of the displacement constant. As a consequence, it is learned that displacement characteristics (displacement constant) of a piezoelectric layer was determined depending on the half-value width of the (200) planes which was measured by means of the wide-angled X-ray diffraction method. Furthermore, the deviation of the B-site atom of the crystal of Comparative Example 1 which was measured by use of the Raman spectroscopic analysis method was larger than that of Comparative Example 2 which was measured by use of the same method. As a consequence, it is learned that the value on the half-value width of the (200) planes corresponded to the deviation of the B-site atom from the center which was measured by means of the Raman spectroscopic analysis method.

Similarly, it is learned that the piezoelectric layer of Example exhibited excellent displacement characteristics for the following reasons. Although the half-value widths of the (100) planes of Example and Comparative Example 1 were not smaller than 0.2 degrees, the half-value of the (200) planes of the piezoelectric layer of Example was not smaller than 2.5 degrees, whereas the half-value of the (200) planes of the piezoelectric layer of Comparative Example 1 was smaller that 2.5 degrees. In addition, the displacement constant of the piezoelectric layer of Example was larger than that of Comparative Example 1. As consequence, it is learned that the piezoelectric layer of Example exhibited excellent displacement characteristics.

It is learned from the foregoing description that, if, like the piezoelectric layer of Example, a piezoelectric layer has the half-value width of the (100) planes which is not larger than 2.0 degrees and the half-value width of the (200) planes which is not smaller than 0.25 degrees, excellent displacement characteristics are obtained from the piezoelectric layer.

Moreover, it is learned that, if the rate of temperature rise which is used while a piezoelectric layer is being baked is as high as 120° C./sec, this makes it possible to form a piezoelectric layer exhibiting excellent displacement characteristics.

Other Embodiments

The Embodiment 1 of the present invention has been described above. However, the basic configuration of the inkjet recording head is not limited to the aforementioned configuration. In the case of Embodiment 1, which has been described above, for example, after the piezoelectric precursor film 71 is applied, dried and degreased, the piezoelectric precursor film 71 is baked, and thus the piezoelectric film 72 is formed. However, the method of forming a piezoelectric layer 72 is not limited to this. It does not matter whether the piezoelectric film 72 is formed in the following manner. First, processes of applying, drying, and degreasing, a piezoelectric precursor film 71 are repeated several times, for example, twice. Thereafter, the piezoelectric precursor film 71 is baked. Thereby, the piezoelectric film 72 is formed.

Furthermore, in the case of Embodiment 1, the lower electrode 60 is formed by patterning. Thereafter, the piezoelectric layer 70 is formed. However, for the convenience of fabricating devices, a first piezoelectric film may be formed on the lower electrode film, and thereafter, the lower electrode film may be patterned along with the piezoelectric layer.

Likewise, in the case of Embodiment 1, iridium (Ir) is used as the material for the lower electrode film 60. However, the material is not particularly limited to this. For example, a conductive material essentially containing iridium (Ir) may be used as the material for the lower electrode film 60. Otherwise, the lower electrode film 60 may be formed by sequentially superposing iridium (Ir), platinum (Pt) and iridium (Ir) over one another.

Figure 6:
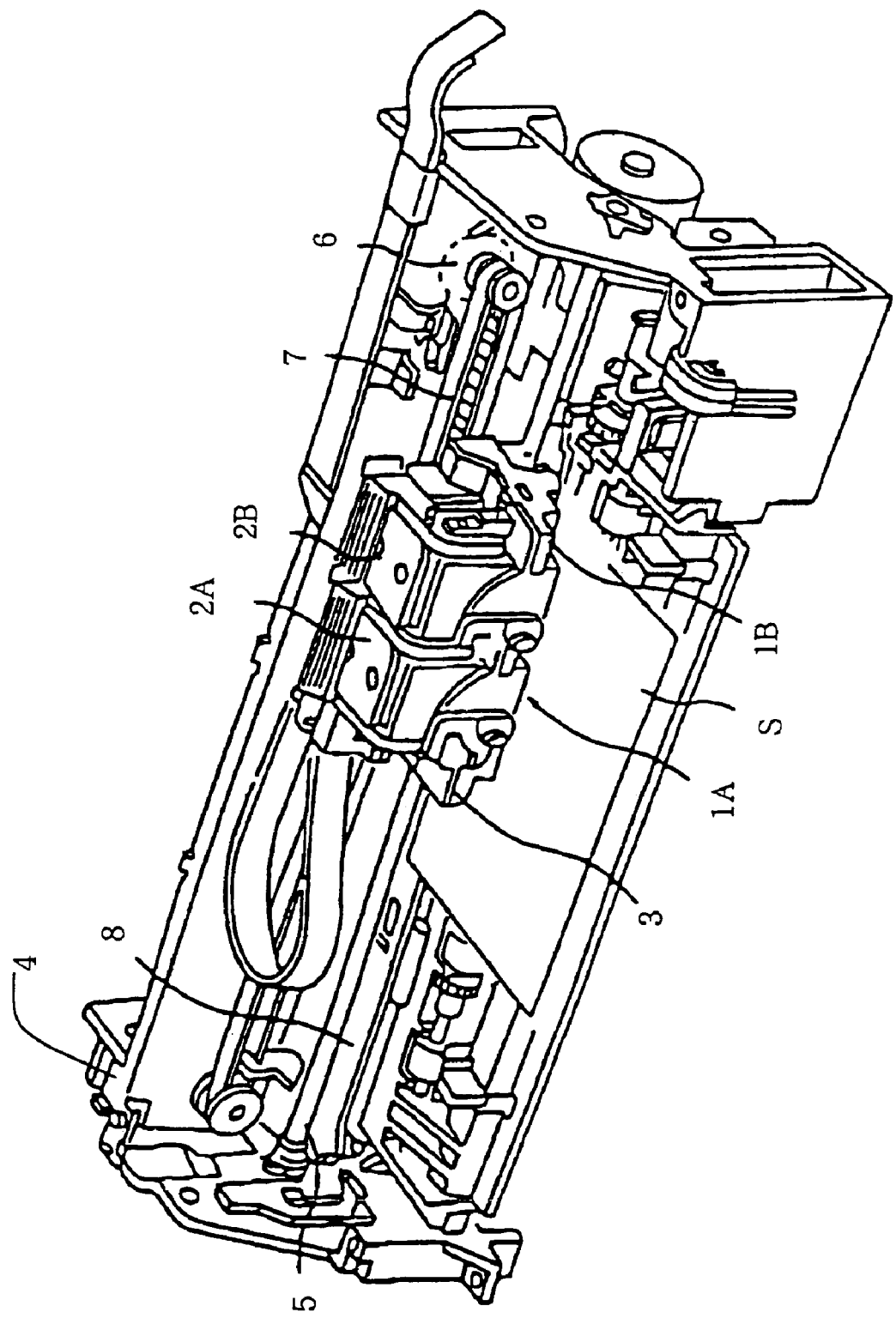
FIG. 6 is a diagram showing a schematic configuration of a recording machine according to an embodiment of the present invention.

In addition, the inkjet recording head according to each of those embodiments constitutes a part of a recording head unit provided with an ink passage communicating with an ink cartridge and the like, and is installed in an inkjet recording apparatus. FIG. 6 is a schematic diagram showing an example of the inkjet recording apparatus.

As shown in FIG. 6, recording head units 1A and 1B including the respective inkjet recording heads are detachably provided to cartridges 2A and 2B constituting ink supply means. A carriage 3 on which the recording head units 1A and 1B are mounted is provided to a carriage shaft 5 fixed to the apparatus main body 4 in a way that the carriage 3 can be freely moved in the direction in which the shaft extends. These recording head units 1A and 1B are assigned to ejecting black ink compositions and color ink compositions respectively.

In addition, a drive power from a drive motor is transmitted to the carriage 3 though a plurality of gears, which are not illustrated, and a timing belt 7. Thereby, the carriage 3 on which the recording head units 1A and 1B are mounted is caused to move along the carriage shaft 5. On the other hand, the apparatus main body 4 is provided with a platen 8 along the carriage shaft 5. A recording sheet S, which is a recording medium such as a sheet of paper, is designed to be transferred on the platen 8. The recording sheet S is fed by feed rollers and the like, although the feed rollers are not illustrated It should be noted that the present invention is intended to be widely applied to the entire range of liquid-jet heads, although Embodiment 1 has been described giving the inkjet recording head as an example of the liquid-jet heads. It goes without saying that the present invention can be applied to any liquid-jet head which ejects a liquid other than ink. Examples of a liquid-jet head which ejects a liquid other than ink include: various recording heads used for image recording apparatuses such as printers; color-material-jet heads used for manufacturing color filters of liquid crystal display devices and the like; electrode-material-jet heads used for forming electrodes of organic EL display devices, FED (Field Emission Display) devices and the like; bio-organic-substance-jet heads used for manufacturing bio-chips.

What is claimed is:

1. A piezoelectric element, comprising:
   a lower electrode;
   a piezoelectric layer; and
   an upper electrode,
   wherein a half-value width of (100) planes of the piezoelectric layer measured by a wide-angled X-ray diffraction is not larger than 0.2 degrees, and a half-value width of (200) planes of the piezoelectric layer measured by the wide-angled X-ray diffraction is not smaller than 0.25 degrees.

2. The piezoelectric element according to claim 1, wherein a thickness of the piezoelectric layer is not smaller than 300 nm.

3. The piezoelectric element according to claim 1, wherein the piezoelectric layer is made of lead-zirconate-titanate.

4. An actuator device, comprising a plurality of piezoelectric elements according to claim 1.

5. An actuator device, comprising a plurality of piezoelectric elements according to claim 2.

6. An actuator device, comprising a plurality of piezoelectric elements according to claim 3.

7. A liquid-jet head, comprising the actuator device according to claim 4 as liquid-jet means which ejects a liquid from nozzle orifices.

8. A liquid-jet apparatus comprising the liquid-jet head according to claim 7.

* * * * *